(12) United States Patent
Fischer et al.

(10) Patent No.: US 6,876,222 B2
(45) Date of Patent: Apr. 5, 2005

(54) AUTOMATED STATOR INSULATION FLAW INSPECTION TOOL AND METHOD OF OPERATION

(75) Inventors: Mark W. Fischer, Pittsburgh, PA (US); George F. Dailey, Pittsburgh, PA (US); James A. Bauer, Gibsonia, PA (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 144 days.

(21) Appl. No.: 10/292,325

(22) Filed: Nov. 12, 2002

(65) Prior Publication Data

US 2004/0100270 A1 May 27, 2004

(51) Int. Cl.$^7$ .......................... G01R 31/34; G01R 31/14
(52) U.S. Cl. ....................... 324/772; 324/510
(58) Field of Search ................... 324/510, 511, 324/522, 545, 546, 772, 222; 73/865.8

(56) References Cited

U.S. PATENT DOCUMENTS

| | | |
|---|---|---|
| 4,658,213 A | 4/1987 | Finley |
| 4,803,563 A | 2/1989 | Dailey et al. |
| 4,901,572 A | 2/1990 | Suyama |
| 4,962,660 A * | 10/1990 | Dailey et al. ............. 72/12.09 |
| 4,970,890 A | 11/1990 | Jaafar et al. |
| 4,996,486 A | 2/1991 | Posedel |
| 5,020,234 A | 6/1991 | Alkire et al. |
| 5,105,658 A | 4/1992 | Jaafar et al. |
| 5,105,914 A * | 4/1992 | Holden ....................... 187/201 |
| 5,252,915 A | 10/1993 | Sedding et al. |
| 5,321,362 A | 6/1994 | Fischer et al. |
| 5,341,095 A | 8/1994 | Shelton et al. |
| 5,365,166 A | 11/1994 | Dailey et al. |
| 5,557,216 A | 9/1996 | Dailey et al. |
| 5,907,244 A | 5/1999 | Crabill et al. |
| 6,051,987 A | 4/2000 | Stokes |

FOREIGN PATENT DOCUMENTS

EP 0684483 A2 11/1995

OTHER PUBLICATIONS

J. Sutton, EL–CID—An Easy Way to Test Stator Cores, CEGB Research, Jun. 1982, pp. 15–21.
J.W. Shelton & B.M. Reichman, A Comparative Analysis of Turbo–Generator Core Inspection Techniques, Westinghouse Power Generation Service Division, American Power Conference, Apr. 22–25, 1985 & Pacific Coast Electrical Assn, Mar. 19–20, 1985.
M.W. Fischer et al., "Electromagnetic Stator Insulation Flaw Detector", U.S. Appl. Ser. No. 10/186,048, filed Jun. 28, 2002.
J. Sutton, "EL CID: An Easier Way to Test Stator Cores", Electrical Review, Jul. 1980, vol. 207, 33–37.

* cited by examiner

*Primary Examiner*—N. Le
*Assistant Examiner*—Jeff Natalini

(57) ABSTRACT

An automated tool for performing an EL CID inspection of the step iron region of a generator stator that can be employed with the rotor in place. The tool has a track that is axially cantilevered at one end and supported magnetically within a stator slot adjacent the region to be monitored. The track has a smoothly rounded contour that approximately conforms to the profile of the stator step region. A carriage carrying a pickup coil is slideably mounted on the track and is driven back and forth along the track over the area to be inspected by a remotely-operated drive system. A video camera is mounted on the track and provides a remote visual indication of the location of the carriage relative to the stator.

19 Claims, 1 Drawing Sheet

AUTOMATED STATOR INSULATION FLAW INSPECTION TOOL AND METHOD OF OPERATION

BACKGROUND OF THE INVENTION

1. Field of the Invention

The present invention relates generally to the inspection of electrical generators using electromagnetic detectors and, more particularly, to an automated inspection tool and method of operation that is particularly applicable to the step iron region of a generator stator and can be operated with the rotor in place.

2. Related Art

This application relates to co-pending application Ser. No. 10/186,048, filed Jun. 28, 2002 which describes an electromagnetic stator insulation flaw detector and method which can be employed with this invention. The stator core of a typical large generator, for example, a 500 megawatt generator, weighs 200 tons, is approximately 6 meters long, 2.6 meters in diameter and has a bore of 1.3 meters. The stator is built from a stack of approximately 200,000 individual steel sheets of laminations, each approximately 0.3 mm thick and coated, for example, with a varnish to insulate it electrically from the adjacent laminations and the windings that are inserted in peripheral slots that extend circumferentially around the laminations. The core is held together on its outside by steel building bars. On its inside, it carries a winding made from electrically insulated copper bars embedded in slots between the rows of inward facing teeth around the bore.

Within the bore of the stator lies the rotor, which is spun by the mechanical power of turbines to induce electrical power in the stator winding. The rotor itself carries a winding, which is energized by direct current provided by an exciter. As the magnetic flux produced by this winding rotates, it intersects the stator winding and generates alternating current power, which is the generator's required output. The function of the steel laminations is to insure that the stator core presents a path of low magnetic impedance to the spinning rotor flux.

It is vital, however, to prevent unwanted currents from being generated in the steel of the core (as opposed to the desired currents in the stator winding). The result of generating the unwanted currents would be serious overheating in the core. This is why the laminations are each coated with a thin layer of electrical insulation. The insulation on a group of laminations may, however, become damaged near the bore surface during assembly, operation or maintenance. If this happens, a conducting circuit may be completed since in many stators, the laminations are also in electrical contact with each other at their outer edges where they are supported by the building bars. The rotating flux will then induce currents around these circuits which can lead to troublesome overheating or hot spots in the damaged area. Hot spots usually occur on or near the stator teeth.

If allowed to persist, the hot spots can damage or possibly cause failure of the electrical insulation around the conductors of the stator winding, necessitating replacement of the conductor. There have been instances where hot spots have grown to such an extent that the core itself has had to be rebuilt.

Primitive forms of hot spot detection at the surface involved exciting the core to an operating flux density by means of a temporary high power ring flux loop (HPRFL). This technique uses a heavy gauge cable loop installed such that it extends through the bore of the stator, then around the outside of the frame, and then through the bore again. Three to ten turns are normally required. The loop is energized with a high voltage and observers are positioned in the bore to manually examine the surface of the stator. If the area to be examined is limited, the HPRFL method can be used to excite the core after the suspected area is treated with paraffin or paints that change color when heated.

A thermographic inspection technique is an alternative to the hands-on observation of stator damage. This technique also employs the HPRFL to excite the core to operational flux density levels. The entire surface area of the core structure can then be scanned with a television-style camera that is sensitive to infrared radiation. The entire examination is done from the outside end of the core looking into the bore, but it is often desirable to de-energize the HPRFL for a short time to enter the bore and pinpoint sources of heat.

More recently, electromagnetic detectors such as the Electromagnetic Core Imperfection Detector (EL CID) described in U.S. Pat. No. 5,321,362 have been employed for this purpose. This technique employs an excitation loop of No. 10 AWG 300-volt wire (usually 6 turns) installed in the bore of the stator core, often suspended along the center line and around the frame in a manner similar to that of the HPRFL technique. The loop is then connected to a source of constant frequency amplitude-adjustable AC voltage (a 240-volt Variac) and energized. A separate single-turn search coil determines when the proper level of excitation is obtained. The flux level is approximately 4% of the operating flux density. At this low density, technicians can safely enter the bore with a pickup device that detects axial currents in the laminations or the pickup device can be inserted remotely with small robots such as that described in U.S. Pat. No. 5,557,216, assigned to the assignee of the instant application. The pickup is moved over the entire bore surface in a series of overlapping patterns while the output is observed on a meter and/or plotted on an X-Y recorder or computer. Any areas of elevated axial current in the laminations along the surface or some distance below the surface will be indicated as peaks on the output device. The need for corrective action can be determined objectively by analyzing the peaks. This technique is more fully described in publication, Sutton, J., July 1980, *Electrical Review*, Vol. 207, No. 1, "EL CID: An Easier Way to Test Stator Cores", 33–37. The outputs of the pickup coil can be further processed and analyzed by a computer, which can compare the information to known reference values to assist in characterizing the flaw that was identified. The results provide information on the location of the flaw, but not its radial depth. The aforesighted application Ser. No. 10/186,048 addresses this issue. However, it is still difficult to obtain accurate readings from the pickup coil in the stator step iron region due to the abrupt changes in contour axially over that region. The stepped changes in the region's contour makes it difficult to manually, smoothly move the pickup coil over that region to avoid distorted outputs. It is even more difficult to avoid distorted outputs when a miniature robot is used to move the coil over that region.

Accordingly, it is an object of this invention to provide an improved electromagnetic stator inspection tool that can more easily inspect the step iron region of a generator stator and provide accurate outputs.

Furthermore, it is an object of this invention to provide such a tool that can be operated remotely.

In addition, it is an object of this invention to provide such a tool that can enable inspection of the step iron region of a stator with the rotor in place.

SUMMARY OF THE INVENTION

These and other objects are achieved by an electrical generator inspection system for detecting insulation breakdown axially between two or more adjacent laminates of a generator stator core, that employs a track generally shaped to approximately conform to at least a portion of the axial profile of the generator. The track is supported proximate the axial region of the generator to be inspected. A carriage rides along and is supported by the track between the track and the generator stator core. An electromagnetic detector for identifying eddy currents flowing between laminates is supported by the carriage between the carriage and the generator stator core. The carriage is driven remotely along the track over the region to be inspected. Preferably, the track is supported at one end within a slot of the stator at the circumferential portion of the stator to be inspected along an axial length. The track is held in the slot position by magnetic force. Most advantageously, the axial length to be inspected is the step iron region of the stator and the track in the region of the step iron portion has a smooth contour that generally conforms to the contour of the step iron region.

In the preferred embodiment, the carriage is driven by a DC motor with an encoder that identifies the position of the carriage on the track. The drive train includes a return spring which is mounted proximate one end of travel of the carriage on the track and the other end of the return spring is connected to the carriage. The motor is connected to the side of the carriage opposite the return spring through a drive line. Preferably, the return spring and the motor are supported at approximately the same location along the track and the drive line is routed through a pulley system at approximately the other end of the track.

In a further embodiment of the invention, a video camera is supported on the track to follow the movement of the carriage along the track to give an operator a visual reference of the location of the carriage.

BRIEF DESCRIPTION OF THE DRAWINGS

The invention may be better understood, and further advantages and uses thereof are readily apparent, when considered in view of the following detailed description of the exemplary embodiments, taken with the accompanying drawings in which.

DESCRIPTION OF THE PREFERRED EMBODIMENT

Figure 1:
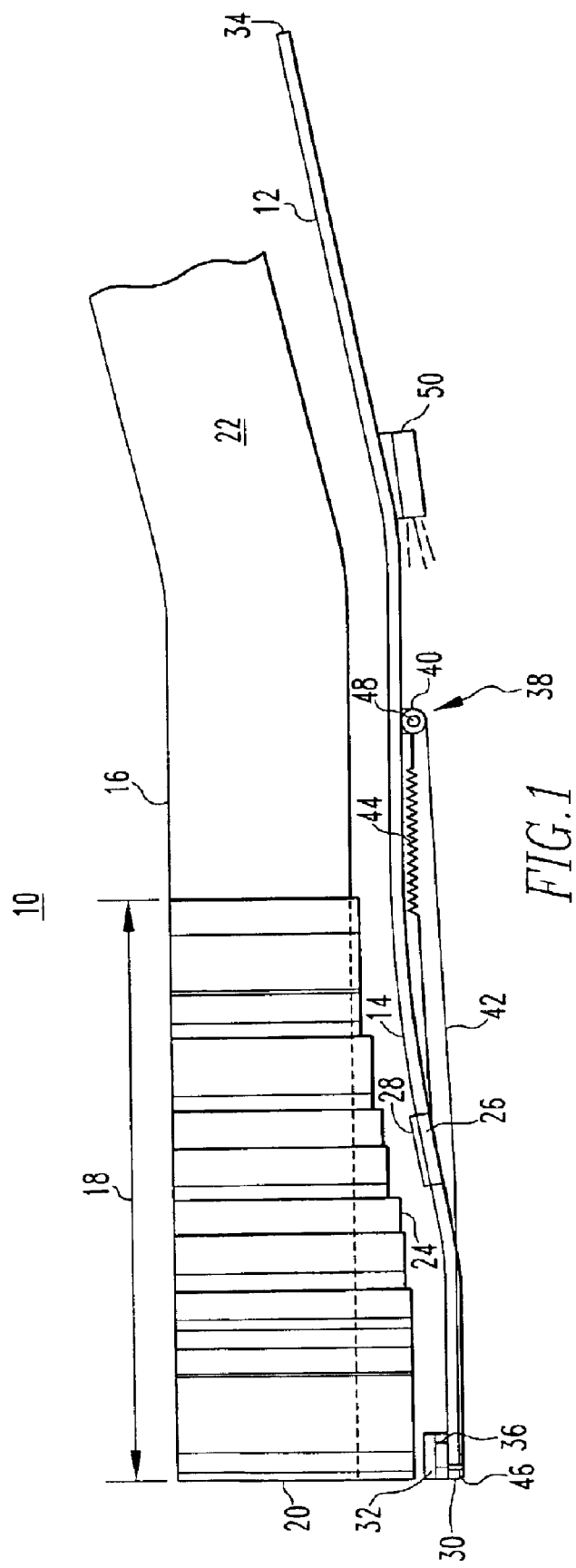
FIG. 1 is a schematic illustration of the automated EL CID step iron inspection tool of this invention.

The EL CID test previously described is commonly performed on generator stator cores over the main body iron and on the step iron regions. The EL CID test is normally performed with the rotor removed, but since 1989, this test has been performed remotely with the rotor in place using a robotic carriage. The limitation of the robotic carriage is that it cannot perform the EL CID test on the step iron region of the stator core. This invention enables the step iron region to be tested with the rotor in place, and provides improved inspection techniques for performing the tests with the rotor removed. The current manual tool that is used with the rotor removed can be difficult to manipulate correctly especially over the step iron region. If the pickup coil is not handled correctly, the output readings could be distorted and mask damaged insulation. This invention overcomes those difficulties by providing an automated tool capable of accurately monitoring the step iron region of the stator, as well as the straight main body iron of the stator, with the rotor in place.

FIG. 1 shows a profile, schematic view of the automated EL CID inspection tool 10 of this invention. A laminated track 12 is supported near the axial and circumferential portion of the stator 16 to be inspected. The contour of the track transitions over a smooth arc in the stator step iron region to closely conform to the profile of the region 18 without having the abrupt transitions that the steps 24 introduce. The track 12 is laminated and the laminations are formed from fiberglass so that the carriage 26 that supports the pickup coil 28 can smoothly transition from the main body iron 20 to the step iron region 18. This is critical because if the pickup coil does not move smoothly, then the data it collects will be distorted and difficult to evaluate. The front 30 of the track 12 is positioned near the generator opening and has a slot guide 32 adapted to be inserted within a stator slot to support the track above and adjacent the area to be scanned. The slot guide 32 shape generally conforms to the shape of the coil slot in which it is to be inserted. A magnet 36 is inserted within the slot guide 32 to hold the slot guide within the slot and support the track 12. The pickup coil 28 is mounted onto the carriage 26 between the carriage and the stator 16. The carriage 26 is slideably affixed to the track 12 in a manner that allows it to move from the front of the tool 30 toward the back end of the track 34.

A drive system 38 is provided for moving the carriage from one point on the track to another corresponding to the region to be inspected. In FIG. 1, the drive system is set up to inspect the stator step iron region 18 though it should be appreciated that the drive path can be extended to cover the area over the main body iron 20 by positioning the drive motor 40 further down the track 12 towards the end of the track 34. The drive system 38 includes the drive motor 40 which is preferably a DC motor and a drive line 42 which is routed around a pulley system 46 to one end of the carriage 26. The drive line is connected at the opposite end of the carriage 26 to a return spring 44 which, in this embodiment, is anchored to the mount of the motor 40. The motor 40 has a take-up reel to which the drive line is connected. The motor 40 turns in a direction to take up the drive line and move the carriage toward the front 30 of the track 12. When the motor is driven in the opposite direction, the return spring 44 smoothly moves the carriage 26 back towards the motor 40. The motor also has an encoder 48 built into it to provide position feedback information so that the operator of the tool knows where the pickup coil is located at any point in time. A camera 50 is also built into the tool and has a view angle wide enough to follow the carriage and its position relative to the stator 22 to provide a visual reference point to the field engineer who is remotely operating the tool.

Preferably, two people are used to operate the tool. One person to insert the tool into the desired stator slot and another person who will view the video monitor and operate the tool and the EL CID equipment. Once the tool is positioned correctly in the stator slot, the operator tells the tool to move the pickup coil. The DC motor moves the cable, causing the carriage 26 carrying the pickup coil 28 to slide down the laminated track 12. The track 12 is straight in the main body iron area 20 and then slopes as it covers the step iron region 18. This curved section keeps the pickup sensor from bouncing off each step, and thus keeps the EL CID signal from being distorted. By viewing the video camera, the operator will move the EL CID sensor until it reaches the end of the step iron region or further area to be monitored. At this point, the scan is complete and the tool is moved to the next stator slot until the area corresponding to each stator slot has been monitored.

Thus, this invention provides an improved tool and method of operation that enables the entire stator to be monitored with the rotor in place and improves the quality of the output signal received for the stator step iron portion over that achievable currently from manual inspections.

While specific embodiments of the invention have been described in detail, it will be appreciated by those skilled in the art that various modifications and alternatives to those details could be developed in light of the overall teachings of the disclosure. Accordingly, the particular embodiments disclosed are meant to be illustrative only and not limiting as to the scope of the invention which is to be given the full breadth of the appended claims and any and all equivalents thereof.

What is claimed is:

1. An electrical generator inspection system for detecting insulation breakdown axially between two or more adjacent laminates of a generator stator core comprising:

a track supported by and spaced from the generator stator core and generally shaped to approximately conform to at least a portion of the axial profile of the generator stator core;

a carriage that rides along and is supported by the track between the track and the generator stator core;

an electromagnetic detector for identifying eddy currents flowing between laminates in the stator core, said electromagnetic detector being supported by said carriage between the carriage and the generator stator core; and drive means for remotely moving the carriage along the track.

2. The electrical generator inspection system of claim 1 wherein a slot guide is affixed substantially at one end of said track to support the track in the axial direction when the slot guide is positioned in a coil winding slot of the generator stator core.

3. The electrical generator inspection system of claim 2 wherein the slot guide is magnetic.

4. The electrical generator inspection system of claim 3 wherein a magnet is supported within the slot guide.

5. The electrical generator inspection system of claim 2 where in the shape of the slot guide generally conforms to the shape of a cross-section of the generator slot.

6. The electrical generator inspection system of claim 1 wherein the track is laminated.

7. The electrical generator inspection system of claim 1 wherein the portion of the axial profile of the generator that the track generally conforms to is a stator stop iron region.

8. The electrical generator inspection system of claim 7 wherein the track is straight in the main body iron area and slopes as it covers the step iron region.

9. The electrical generator inspection system of claim 8 wherein the truck is smoothly curved with no abrupt steps as it generally conforms to the shape of the stator step iron region.

10. The electrical generator inspection system of claim 1 wherein the drive means comprises a motor with an encoder that identifies the position of the carriage on the track.

11. The electrical generator inspection system of claim 10 wherein the drive means includes a return spring which is mounted at one end of travel of the carriage on the track and at the other end the return spring is connected to the carriage and the motor is connected to the side of the carriage opposite the return spring through a drive line.

12. The electrical generator inspection system of claim 11 wherein the return spring and the motor are supported at approximately the same location along the track and the drive line is routed through a pulley system at approximately the other end of the track.

13. The electrical generator inspection system of claim 10 wherein the motor is a DC motor.

14. The electrical generator inspection system of claim 1 including a video camera mounted directly on the track to follow movement of the carriage along the track to give an operator a visual reference of the location of the carriage.

15. A method of inspection a generator stator core comprising the steps of:

supporting and spaced from a generator stator core slot a track that has a smooth contour that generally conforms to the axial contour of a step iron region of the generator, axially over the step iron region;

remotely moving a carriage having an electromagnetic detector positioned between the carriage and the stator core, along the track over the step iron region of the generator; and remotely monitoring the position of the carriage and an output of the electromagnetic detector.

16. The method of claim 15 including the step of remotely viewing the carriage as it moves along the track.

17. The method of claim 16 wherein the remotely viewing step includes the step of framing at least a portion of the carriage and the adjacent stator step iron region in the same picture to provide a visual image of the relative location of the carriage.

18. The method of claim 15 wherein the supporting step includes the step of anchoring the track in the slot in the stator substantially at one end of the track.

19. The method of claim 18 wherein time anchoring step is accomplished with magnetic force.

* * * * *